United States Patent [19]

Valdmann

[11] 4,323,909
[45] Apr. 6, 1982

[54] PLANAR AVALANCHE DIODE WITH A BREAKDOWN VOLTAGE BETWEEN 4 AND 8 VOLTS

[75] Inventor: Henri Valdmann, Paris, France

[73] Assignee: Thomson-CSF, Paris, France

[21] Appl. No.: 140,486

[22] Filed: Apr. 15, 1980

[30] Foreign Application Priority Data

Apr. 20, 1979 [FR] France ............................... 79 10065

[51] Int. Cl.³ ............................................. H01L 29/90
[52] U.S. Cl. ..................................................... 357/13
[58] Field of Search ....................... 357/13, 20, 52, 53

[56] References Cited

U.S. PATENT DOCUMENTS

| 3,391,287 | 7/1968 | Kao et al. | 357/20 |
| 4,030,117 | 6/1977 | Kling | 357/13 |
| 4,129,878 | 12/1978 | Webb | 357/13 |

FOREIGN PATENT DOCUMENTS 2649935  6/1977  Fed. Rep. of Germany.

OTHER PUBLICATIONS

Keil et al., "Low-Noise Silicon Planar Detectors for Room Temperature Application", *Nuclear Instruments and Methods,* vol. 104, No. 1, (1972), pp. 209-214, 357-352.

IEEE Transactions on Electron Devices, vol. Ed-23, May 1976, No. 5, (New York).

R. B. Fair et al.: "Zener and avalanche breakdown in As-implanted low-voltage Si n-p junctions", pp. 512-518.

*Primary Examiner*—R. A. Rosenberger
*Attorney, Agent, or Firm*—Roland Plottel

[57] ABSTRACT

A diode comprising a N-type substrate in which is formed a P-type guard ring and a central diffusion of the same type but of reduced depth. Part of the central diffusion layer is interrupted by a masking island. Diffusion is for example obtained from an epitaxial layer.

8 Claims, 7 Drawing Figures

PRIOR-ART

PLANAR AVALANCHE DIODE WITH A BREAKDOWN VOLTAGE BETWEEN 4 AND 8 VOLTS

BACKGROUND OF THE INVENTION

The present invention relates to a novel planar avalanche diode construction and more particularly to such diodes having a breakdown voltage between 4 and 8 volts.

It is pointed out that the breakdown of diodes is dependent on two separate physical phenomena. In the range of low breakdown voltages (below 4 V) a Zener effect occurs, i.e. a transition of the bonding electrons in the conduction band under the effect of a very high electrical field. In the range of higher voltages (above 8 V) there is an avalanche effect by carrier multiplication in the space charge zone. Thus, from the theoretical standpoint, a distinction should be made between a Zener diode and an avalanche diode. In practice, these diodes are either called Zener diodes or avalanche diodes, independently of the physical phenomenon involved. For example, the breakdown voltage is generally designated by the reference $V_Z$, which normally refers to the Zener effect, even in the case where there is in fact an avalanche effect.

In FIG. 1, dotted lines are used for a characteristic curve 10 of a Zener diode with a threshold voltage for example below 4 V, whilst continuous lines indicate a characteristic curve 11 of an avalanche diode with a breakdown voltage for example above 8 V. In general terms, it should be noted that the characteristic curve of a diode operating by the avalanche effect has a very marked bend and a low dynamic impedance $R_{ZK}$ in the vicinity of the bend. However, with a diode functioning with the Zener effect, for reasons inherent in said effect there is a relatively rounded bend, i.e. a higher dynamic impedance.

Greater interest is attached here to Zener diodes whose breakdown voltage is between 4 and 8 V. In this range, the physical effect involved is partly a Zener effect and partly an avalanche effect and, as a function of the construction methods used, breakdown characteristics with a more or less rounded bend are obtained.

FIGS. 2A and 2B show two conventional planar Zener diode constructions according to the prior art. FIG. 2A shows a planar Zener diode in which a P diffusion 1 is formed in a N substrate 2 by means of a silicon dioxide mask 3 providing a window through which diffusion takes place. By using this construction, Zener diodes with a relatively pronounced bend are obtained in this voltage range. However, these diodes have the disadvantage that the characteristics vary as a function of the duration of use, i.e. as a function of time the bend becomes rounder and the breakdown voltage can vary, whilst the inverse current increases. To obviate this, the prior art uses the construction shown in FIG. 2B in which the P diffusion 1 shown in FIG. 2A is surrounded by a zone 4 of deeper diffusion P. This construction is normally called the guard ring construction. It should be noted that for guard ring diodes as shown in FIG. 2B, reliability is better than in the case of the diodes shown in FIG. 2A, i.e. the initial characteristics are maintained as a function of time. However, these guard ring diodes have a breakdown characteristic with a much rounder bend than diodes without a guard ring, as shown in FIG. 2A.

Thus, in practice, it is necessary to make a choice between a diode with good initial characteristics, but poor reliability and a diode with good reliability, but relatively unsatisfactory breakdown characteristics.

BRIEF SUMMARY OF THE INVENTION

Thus, one object of the present invention is to provide for the voltage range substantially between 4 and 8 V a novel Zener construction, making it possible to obviate the disadvantages of the prior art, i.e. combining the advantages of a completely satisfactory characteristic and a good reliability.

Firstly, a number of theoretical considerations will be described making it possible to explain the present invention, whilst taking account of the construction claimed hereinafter has proved to function satisfactorily and that any inaccuracy in the theoretical description of the phenomena will not prejudice the patentability of the invention, because these explanations are only given for information purposes.

On considering the construction of FIG. 2A and more particularly the junction between layers P and N, it should be noted that this junction has a central region having a breakdown voltage $V_{ZC}$ and a lateral region with a radius of curvature R and having a breakdown voltage $V_{ZL}$ with $V_{ZL} < V_{ZC}$ ($V_{ZC} - V_{ZL}$ is estimated to be between 200 and 700 mV for a 6 V diode). The breakdown of such a junction appears firstly in the lateral zone or curved zone of the junction. Thus, the low level breakdown occurs in this peripheral zone having a very small cross section, which is constant between different samples, and structural defects are masked. Therefore, the low level dynamic impedance $R_{ZK}$ is low and there is only limited dispersion between individual samples, i.e. there is a marked bend in the characteristic curve.

In the case of FIG. 2B, the diode still has the central region of breakdown voltage $V_{ZC}$, but in this case the guard ring has a breakdown voltage $V_{ZG}$ which is higher than $V_{ZC}$. It has been experimentally found that the breakdown of junctions with a guard ring occurs in the central zone and extends progressively throughout the zone when the current increases. The avalanche is non-uniform, due to the structural defects of the junction which are difficult to obviate (heterogeneous doping of the substrate, heterogeneous concentration of the doping agent and dislocations induced by diffusion). Thus, a relatively rounded bend is obtained. The area of the junction involved by the low level avalanche is still less than the area of the central zone, but varies from one sample to the next.

The Applicant has also investigated the reasons leading to the reliability deficiency in diodes without a guard ring. The Applicant considers that one of the main reasons is the fact that alkaline ions are introduced into the silica layer 3, for example at the time of fitting the diode. During diode operation, these alkaline ions progressively migrate towards the junction-surface intersection zone and modify the distribution of the space charge and consequently the initial breakdown voltage of the diode. This also explains why the characteristics of a guard ring diode are relatively reliable. Thus, in this case, even if the alkaline ions migrate in the silica layer 3 towards the zone where the junction intersects the surface of the semiconductor body, said ion migration does not influence breakdown, in view of the fact that it is not the zone adjacent to the intersection of the junction which determines the start of the avalanche, the latter starting, as indicated hereinbefore, in the vicinity of the central region of a guard ring diode.

According to the present invention, a guard ring diode is provided in which, within the zone defined by said ring is provided on intersection of the junction with the shallowly diffused layer at the surface of the said diode in order to determine the avalanche threshold. To prevent any contamination, the said intersection zone is protected by a protective layer. Moreover, the silica layer can itself be protected by a silicon nitride film in order to improve its protection against contaminants.

Thus, the present invention provides a planar avalanche diode with a breakdown voltage between 4 and 8 volts incorporating a silicon substrate of a first type of conductivity coated with a silica mask through which diffusion takes place to supply a layer of a second type of conductivity which is opposite to the first, the perimeter of the diffused zone being surrounded by a zone of deeper diffusion, the mask blocking the diffusion in certain zones within the diffusion perimeter and at least that part of the mask within this perimeter being covered with a protective coating. The protective coating can in particular be constituted by an epitaxial layer or simply by the metallizations for electrical connections.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

It should be firstly noted that, as is usual in the field of semiconductors, the drawings are not shown to scale and instead certain parts thereof have been made larger to make understanding thereof easier.

Figure 3:
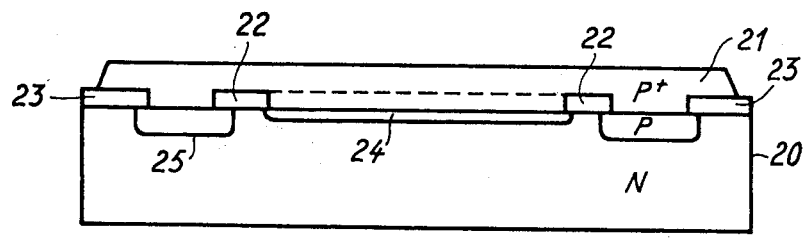
FIG. 3 a first embodiment of the Zener diode according to the present invention.

FIG. 3 shows an epitaxial diode with a type N substrate 20 on which is formed by epitaxy a type P+ layer 21, said layer bringing about the formation, by diffusion through a mask incorporating a first ring 22 and a second ring 23, of a central diffusion zone 24 and a peripheral diffusion zone 25. The peripheral zone corresponds to a guard ring. To carry this out, prior to the formation of the epitaxial layer, there should be a prior diffusion corresponding to ring 25 by using a mask, such as that shown by dotted lines and covering the entire central surface of the diode. The lateral spacing between layers 24 and 25 exceeds the thickness of the space charge zone. In the voltage range in question, the thickness of the space charge zone can be about 0.1 micron. However, the lateral spacing between the edges of diffusion zones 24 and 25 will exceed 10 microns.

With the diode of FIG. 3 following the various metallization processes and during installation a contamination of the peripheral silica mask 23 could occur as from the outside, but mask 22 covered by the epitaxial layer and possibly by subsequent metal coatings cannot be contaminated.

Figure 1:
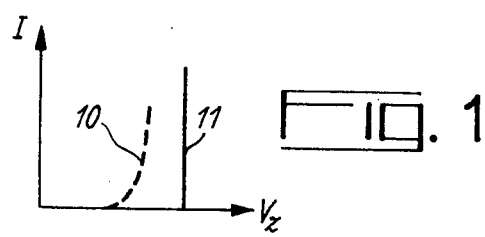
FIG. 1 various current—voltage characteristics of Zener diodes.
Figure 2A:
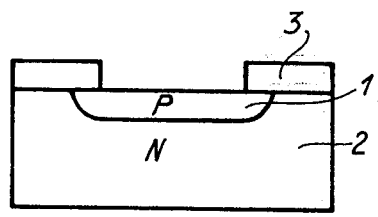
FIGS. 2A and 2B planar Zener diodes according to the prior art.
Figure 2B:
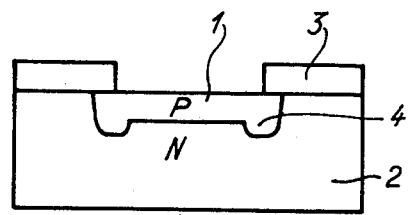

Thus, bearing in mind the theoretical explanations given hereinbefore, the breakdown of the diode occurs at the edges of layer 24, as in the case of the diode without a guard ring shown in FIG. 2A. In this way, a characteristic curve with a very marked bend is obtained, i.e. slightly rounded only, and this characteristic has good temperature stability in view of the fact that the silica layer 22 cannot be contaminated by alkaline ions which are liable to migrate to it. Even if the theoretical explanation given is incorrect experience has shown that the diode shown in FIG. 3 has both a good voltage—current characteristic and a good stability with time.

Figure 4:
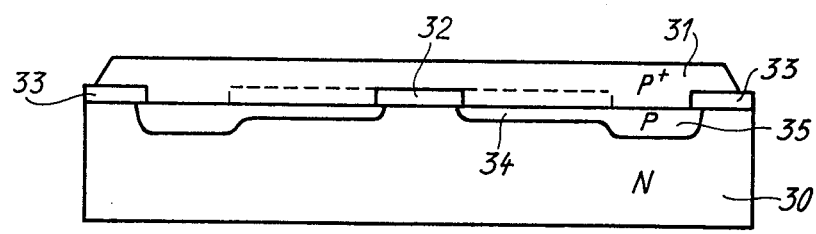
FIG. 4 a second embodiment of the Zener diode according to the present invention.

FIG. 4 illustrates a second constructional variant of the present invention. It is possible to see a Zener diode incorporating a substrate 30, an epitaxial layer 31 and a diffusion mask with a central island 32 and a lateral ring 33. Epitaxial layer 31 brings about a diffusion of its doping agent into the substrate to form a diffused layer 34. As in the case of FIG. 3, prior to the formation of epitaxial layer 31 a prior diffusion has taken place in substrate 30 to form a diffused ring 35 with the opposite conductivity type to that of the substrate. The mask for forming said first diffusion of the guard ring is illustrated by dotted lines in FIG. 4. The expected results of the present invention were observed on a device like that shown in FIG. 4.

Figure 5:
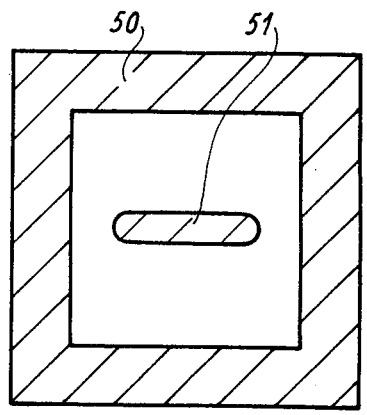
FIGS. 5 and 6 plan views of a Zener diode according to different embodiments of the present invention.

FIG. 5 is a plan view of an oxide mask for obtaining a construction like that of FIG. 4, said mask comprising a peripheral silica ring 50 (the term ring is used in the widest sense to designate a closed continuous surface surrounding the diode along the perimeter thereof and which in the present case is square) and a central island 51. The central island is shown in the form of an elongated strip which can, if appropriate, be circular, cruciform, star-like or finger-shaped.

The precise shape of the islands and their dimensions must be compatible with a clearly marked bend at a low current level, a good dynamic impedance at high current level and a behaviour under overload conditions which is not or only slightly affected by the presence of the island.

In connection with the latter point, the surface occupied by the island must be minimized. In the case where the islands are in the form shown in FIGS. 5 and 6, the width of the fingers is equal to or less than 10 $\mu$m and the length approximately 50 to 200 $\mu$m is a function of the current level used.

Figure 6:
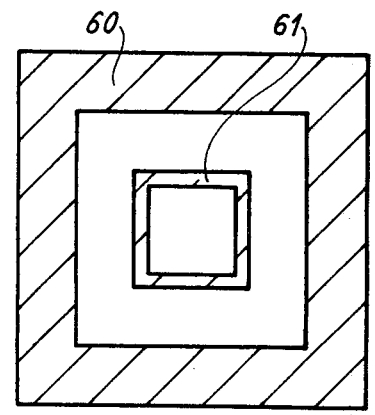

FIG. 6 shows in plan view another embodiment of the oxide mask for producing a diode according to the invention. This mask once again has a peripheral ring 60 and also a smaller diameter ring 61 (once again the terms ring and diameter are used in the widest sense). Ring 61 can be located at the limit of the guard ring in order to correspond to the case of FIG. 3 or can have a smaller diameter.

The embodiments described hereinbefore were related to epitaxial diodes, but the invention also applies to planar diodes not having an epitaxial layer. In this case, the internal silica mask (island 51 or ring 61) is protected by metallization layers, for example of Al, Cr, Ni or Ag which form the contact with the diode. Furthermore, the guard ring can be formed other than by diffusion, for example by implantation.

Thus, put in a different way, it can be considered that the present invention relates to a planar avalanche diode with a guard ring with interruptions to its junction within the guard ring. Thus, the raising of zone N between rings 22 (FIG. 3) and 61 (FIG. 6) or islands 32 (FIG. 4) and 51 (FIG. 5) can be considered as an interruption to the junction. These interruptions are not necessarily continuous (ring or island), but could be provided at a number of discrete locations within the perimeter defined by the guard ring. It should be noted that these junction interruption locations can be covered with an insulating layer (silica masks 22, 32, 51 or 61) in these specifically described embodiments to prevent the short-circuiting of the junction by the subsequent protective coating (highly doped epitaxial layer or metal coating).

Obviously, in the description hereinbefore, the conductivity types N and P can be interchanged.

The invention is not limited to the embodiments described hereinbefore but covers numerous variants and modifications thereto falling within the scope of the appending claims.

What is claimed is:

1. A planar avalanche diode with a breakdown voltage between 4 and 8 volts incorporating a silicon substrate of a first conductivity type coated with a silica mask through which there is a diffusion to supply a layer of a second conductivity type opposite to the first, the perimeter of the diffused zone being surrounded by a deeper diffusion zone, wherein the said mask blocks the diffusion in a region within the said perimeter and at least that part of the mask within the said perimeter is covered with a protective layer.

2. A diode according to claim 1, wherein the protective layer comprises an epitaxial layer of the second conductivity type.

3. A diode according to claim 1, wherein the protective layer comprises a metallization layer.

4. A diode according to claim 1, wherein the said region is shaped like a ring.

5. A diode according to claim 1, wherein the said region is shaped like a central island.

6. A diode according to claim 1, wherein the said region has a finger shape.

7. A method for the manufacture of a planar avalanche diode with a voltage between 4 and 8 volts from a silicon substrate with a first type of conductivity consisting of forming within the said substrate a deep diffusion peripheral ring, also comprising the diffusion into the perimeter defined by the deep diffusion of a layer of the same type of conductivity but less deep whilst reserving by means of an oxide mask a region inside of said perimeter below which no diffusion takes place and covering at least the said region with a supplementary layer.

8. A method according to claim 7, wherein the diffusion of the less deep layer is formed from an epitaxial layer deposited on the surface of the substrate above the said mask.

* * * * *